(12) United States Patent
Ban

(10) Patent No.: US 11,757,059 B2
(45) Date of Patent: Sep. 12, 2023

(54) PHOTOSENSITIVE SENSOR, MANUFACTURING METHOD THEREOF, AND DISPLAY PANEL

(71) Applicant: BOE Technology Group Co., Ltd., Beijing (CN)

(72) Inventor: Shengguang Ban, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 17/040,989

(22) PCT Filed: Mar. 24, 2020

(86) PCT No.: PCT/CN2020/080946
§ 371 (c)(1),
(2) Date: Sep. 24, 2020

(87) PCT Pub. No.: WO2020/238366
PCT Pub. Date: Dec. 3, 2020

(65) Prior Publication Data
US 2022/0384670 A1     Dec. 1, 2022

(30) Foreign Application Priority Data

May 24, 2019   (CN) .......................... 201910440732.5

(51) Int. Cl.
*H01L 31/105* (2006.01)
*H01L 31/101* (2006.01)
*H01L 31/20* (2006.01)
*G06V 40/13* (2022.01)

(52) U.S. Cl.
CPC ...... *H01L 31/1055* (2013.01); *H01L 31/1016* (2013.01); *H01L 31/202* (2013.01); *G06V 40/1318* (2022.01)

(58) Field of Classification Search
CPC ............. H01L 31/1055; H01L 31/1016; H01L 31/202; H01L 31/02327; H01L 27/1255; G06V 40/1318; G06V 40/1365
See application file for complete search history.

(56) References Cited

U.S. PATENT DOCUMENTS

2004/0214001 A1* 10/2004 Oldenburg ............... B01J 13/02
                                                                   428/407
2007/0278607 A1* 12/2007 Gruhlke .............. H01L 27/1463
                                                                   257/458
(Continued)

FOREIGN PATENT DOCUMENTS

CN        101427383 A      5/2009
CN        102394264 A      3/2012
(Continued)

OTHER PUBLICATIONS

International Search Report for PCT/CN2020/080946 dated Jun. 17, 2020.
(Continued)

*Primary Examiner* — Sitaramarao S Yechuri
(74) *Attorney, Agent, or Firm* — Ling Wu; Stephen Yang; Ling and Yang Intellectual Property

(57) ABSTRACT

A photosensitive sensor, a manufacturing method thereof and a display panel are provided. The photosensitive sensor includes a first type semiconductor layer, an intrinsic semiconductor layer disposed on a side of the first type semiconductor layer, and a second type semiconductor layer disposed on a side of the intrinsic semiconductor layer away from the first type semiconductor layer. The intrinsic semiconductor layer is provided with metal particles capable of generating a surface plasmon effect. The metal particles are dispersely distributed in the intrinsic semiconductor layer.

18 Claims, 3 Drawing Sheets

(56) References Cited

U.S. PATENT DOCUMENTS

| | | | | |
|---|---|---|---|---|
| 2010/0000598 A1* | 1/2010 | Lorenzetti | ......... | H01L 31/03529 |
| | | | | 977/773 |
| 2011/0175085 A1* | 7/2011 | Tiwari | ................ | C03C 17/3678 |
| | | | | 257/53 |
| 2012/0080087 A1* | 4/2012 | Denby | ............ | H01L 31/035281 |
| | | | | 438/57 |
| 2013/0112254 A1 | 5/2013 | Lorenzetti et al. | | |
| 2015/0034160 A1* | 2/2015 | Wu | .................... | H01L 31/0445 |
| | | | | 136/265 |
| 2019/0355862 A1* | 11/2019 | Okamoto | ................. | C25B 1/04 |

FOREIGN PATENT DOCUMENTS

| | | | | | |
|---|---|---|---|---|---|
| CN | 102651421 | A | | 8/2012 | |
| CN | 104916782 | A | | 9/2015 | |
| CN | 104993055 | A | | 10/2015 | |
| CN | 107680988 | A | * | 2/2018 | ........... G06F 3/0412 |
| CN | 109207942 | A | | 1/2019 | |
| CN | 110135388 | A | * | 8/2019 | ........... G06K 9/0004 |
| CN | 110135388 | A | | 8/2019 | |
| WO | WO-2013051470 | A1 | * | 4/2013 | ........... C09K 11/025 |
| WO | 2019069585 | A1 | | 4/2019 | |

OTHER PUBLICATIONS

Office Action dated Nov. 4, 2020 for Chinese Patent Application No. 201910440732.5 and English Translation.

Research on Two-Dimensional Material Photodetector Based on Micro-Nano Structure Regulation; Hebei University of Science and Technology.

* cited by examiner

PHOTOSENSITIVE SENSOR, MANUFACTURING METHOD THEREOF, AND DISPLAY PANEL

CROSS-REFERENCE TO RELATED APPLICATIONS

The present application is a U.S. National Phase Entry of International Application No. PCT/CN2020/080946 having an international filing date of Mar. 24, 2020, which claims the priority and benefit of the patent application with the patent application number 201910440732.5 filed to the China National Intellectual Property Administration on May 24, 2019. The above-identified applications are incorporated herein by reference in their entireties.

TECHNICAL FIELD

The present application relates to the field of display technology, in particular to a photosensitive sensor, a manufacturing method thereof, and a display panel.

BACKGROUND

According to the principle of sensing, fingerprint recognition sensors may be divided into optical fingerprint sensors, capacitive semiconductor sensors, thermal sensitive semiconductor sensors, pressure sensitive semiconductor sensors, ultrasonic sensors and radio frequency sensors and the like. Currently, the fingerprint recognition sensors are widely used in mobile products (such as mobile phones, tablet computers, etc.) to enhance use security of the mobile products.

However, there is still a need for further improving the current fingerprint recognition sensors.

SUMMARY

In one aspect of the present application, the present application provides a photosensitive sensor. The photosensitive sensor includes a first type semiconductor layer, an intrinsic semiconductor layer disposed on a side of the first type semiconductor layer, and a second type semiconductor layer disposed on a side of the intrinsic semiconductor layer away from the first type semiconductor layer. The intrinsic semiconductor layer is provided with metal particles capable of generating a surface plasmon effect. The metal particles are dispersely distributed in the intrinsic semiconductor layer.

In another aspect of the present application, the present application provides a method for manufacturing a photosensitive sensor. According to an embodiment of the present application, the method includes forming a first type semiconductor layer; forming an intrinsic semiconductor layer on a side of the first type semiconductor layer, the intrinsic semiconductor layer provided with metal particles capable of generating surface plasmon effect, and the metal particles dispersely distributed in the intrinsic semiconductor layer; and forming a second type semiconductor layer on a side of the intrinsic semiconductor layer away from the first type semiconductor layer.

In another aspect of the present application, the present application provides a display panel. According to an embodiment of the present application, the display panel includes an array substrate. A photosensitive sensor and a thin film transistor are arranged on the array substrate. The photosensitive sensor is as describe above. The thin film transistor is configured to control the photosensitive sensor.

DESCRIPTION OF THE REFERENCE SIGNS

Figure 1:
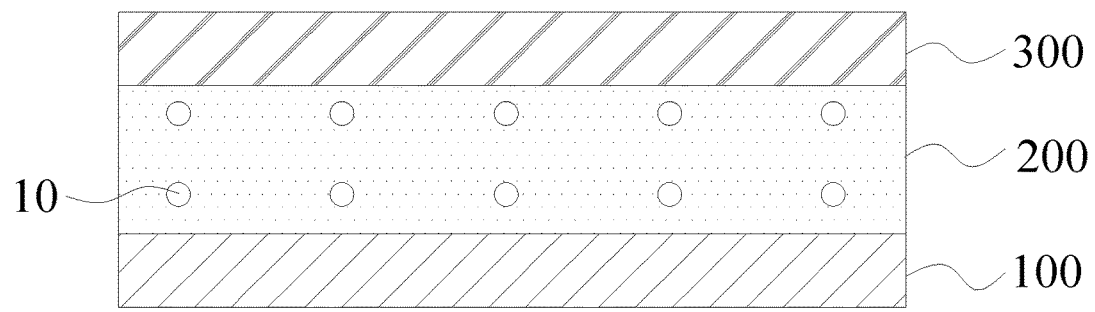
FIG. 1 shows a schematic structural diagram of a photosensitive sensor according to an embodiment of the present application.

100: first type semiconductor layer; 200: intrinsic semiconductor layer; 210: first part; 220: second part; 300: second type semiconductor layer; 400: first electrode; 500: second electrode; 600: array substrate; 700: thin film transistor; 710: gate electrode; 720: gate insulating layer; 730: active layer; 740: source electrode; 750: drain electrode; 1000: photosensitive sensor; 10: metal particle.

DETAILED DESCRIPTION

Description will be made below in detail to embodiments of the present application, examples of which are illustrated in the accompanying drawings. The same or similar elements or the elements having same or similar functions are denoted by same or similar reference numerals throughout the description. The embodiments described below with reference to the accompanying drawings are exemplary, and merely intend to explain the present application, which should not be construed as limiting the present application.

The present application is made on the basis of the inventors' discovery and understanding of the following facts and problems.

At present, the use of fingerprint recognition sensors has specific requirements for the environment, which affects the user experience. For example, when there is residual water on the fingerprint, the fingerprint recognition operation cannot be completed. After in-depth research and extensive experiments, the inventors find that this is mainly caused by low signal-to-noise ratio and sensitivity of the current fingerprint recognition sensors. Currently, in order to solve the problem of low signal-to-noise ratio of the fingerprint recognition sensor, an existing solution adopts a means of reducing the dark current of the fingerprint recognition sensor. In particular, the thin film transistor for controlling the fingerprint recognition sensor is improved, and the oxide thin film transistor with lower leakage current is used. However, improvement of the signal-to-noise ratio by this solution is limited.

In view of this, in one aspect of the present application, the present application provides a photosensitive sensor. According to an embodiment of the present application, referring to FIG. 1, the photosensitive sensor includes a first type semiconductor layer 100, an intrinsic semiconductor layer 200 and a second type semiconductor layer 300. The intrinsic semiconductor layer 200 is disposed on a side of the first type semiconductor layer 100, and the intrinsic semiconductor layer 200 is provided with metal particles 10 capable of generating a surface plasmon effect. The metal particles 10 are dispersely distributed in the intrinsic semiconductor layer 200. The second type semiconductor layer 300 is disposed on a side of the intrinsic sensor layer 200 away from the first type semiconductor layer 100. As a result, the photosensitive sensor has high signal-to-noise ratio and sensitivity, which may significantly improve the user experience.

According to an embodiment of the present application, in the present application, the signal-to-noise ratio of the photosensitive sensor is improved by improving photocurrent. Those skilled in the art can understand that improvement of photocurrent may be carried out by improving quantum efficiency and reducing transmission loss of the photocurrent. Improving quantum efficiency includes improving internal quantum efficiency and improving external quantum efficiency. Reducing transmission loss of photocurrent includes reducing interface defects and reducing intra-crystal defects. However, the inventors find that it is difficult to improve internal quantum efficiency, or to reduce interface defects, or to reduce intra-crystal defects due to limitations of the production line. Therefore, the present application adopts the means of improving external quantum efficiency to improve the signal-to-noise ratio of the photosensitive sensor.

According to an embodiment of the present application, in particular, in order to improve the external quantum efficiency, metal particles capable of generating a surface plasmon effect are added into the intrinsic semiconductor layer. When light is incident on the interface between metal particles and dielectric (such as amorphous silicon in the intrinsic semiconductor layer, or the second type semiconductor layer), a collective oscillation of free electrons on the surfaces of metal particles occurs. The light wave couples with the free electrons on the surfaces of metal particles to form a near-field electromagnetic wave propagating along the surfaces of metal particles. If the oscillation frequency of the free electrons is consistent with the frequency of incident light wave, resonance occurs. Under the resonance state, the energy of electromagnetic field is effectively converted into the collective vibrational energy of the free electrons on the surfaces of metal particles, forming a special electromagnetic mode. The electromagnetic field is confined to a small range on the surfaces of metal particles and is enhanced. As a result, the light absorption rate of the photosensitive sensor may be enhanced, thereby improving the signal-to-noise ratio of the photosensitive sensor and the response capability of the photosensitive sensor.

Description will be made below in detail to various structures of the photosensitive sensor according to specific embodiments of the present application.

According to an embodiment of the present application, the metal particles 10 may include at least one of gold, silver, copper, platinum and aluminum. As a result, the metal particles may generate a surface plasmon effect, thereby enhancing the light absorption rate of the photosensitive sensor and improving the signal-to-noise ratio and sensitivity of the photosensitive sensor.

According to an embodiment of the present application, the metal particles 10 are dispersely distributed in the intrinsic semiconductor layer 200. Disperse distribution means that the metal particles 10 do not form a continuous layered structure in the intrinsic semiconductor layer 200. As a result, it may prevent the formation of a continuous metal layer, avoid the shielding of signals, and avoid the adverse effects of the metal particles on the normal use of the intrinsic semiconductor layer.

Figure 2:
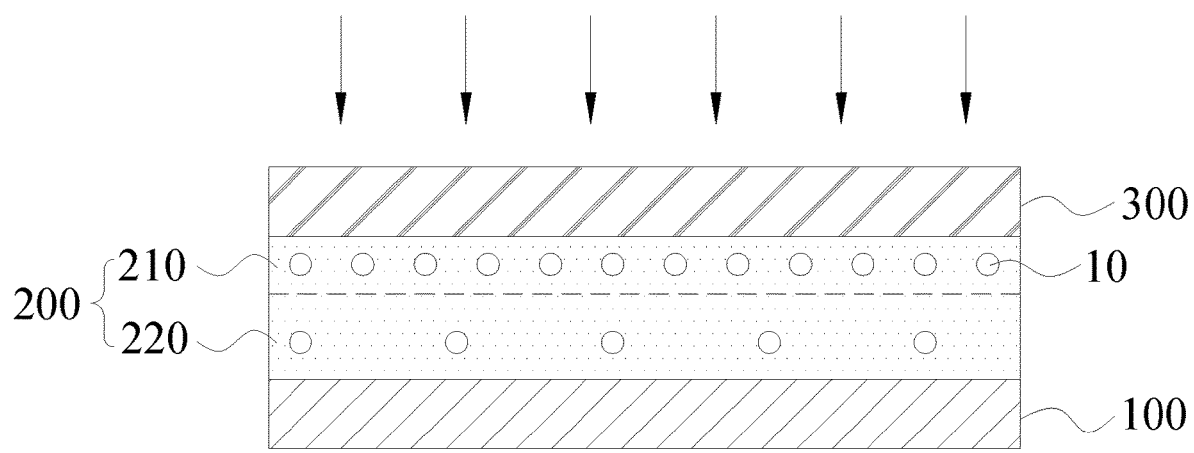
FIG. 2 shows a schematic structural diagram of a photosensitive sensor according to another embodiment of the present application.

According to an embodiment of the present application, referring to FIG. 2, the intrinsic semiconductor layer 200 includes a first part 210 and a second part 220 which are stacked along a thickness direction of the intrinsic semiconductor layer 200. The first part 210 is close to a side of the photosensitive sensor where light enters the photosensitive sensor, and an arrangement density of the metal particles 10 in the first part 210 is greater than an arrangement density of the metal particles 10 in the second part 220. As a result, more metal particles are arranged close to the side of the photosensitive sensor where light enters the photosensitive sensor, so that more metal particles may generate the surface plasmon effect, further enhancing the light absorption rate of the photosensitive sensor, and further improving the signal-to-noise ratio and sensitivity of the photosensitive sensor. It should be noted that "arrangement density" refers to a ratio between the number of the metal particles and the volume of the film layer containing the number of metal particles. The arrangement density of the metal particles 10 in the first part 210 is greater than the arrangement density of the metal particles 10 in the second part 220. That is, the number of metal particles per unit volume in the first part is greater than the number of metal particles per unit volume in the second part.

Figure 3:
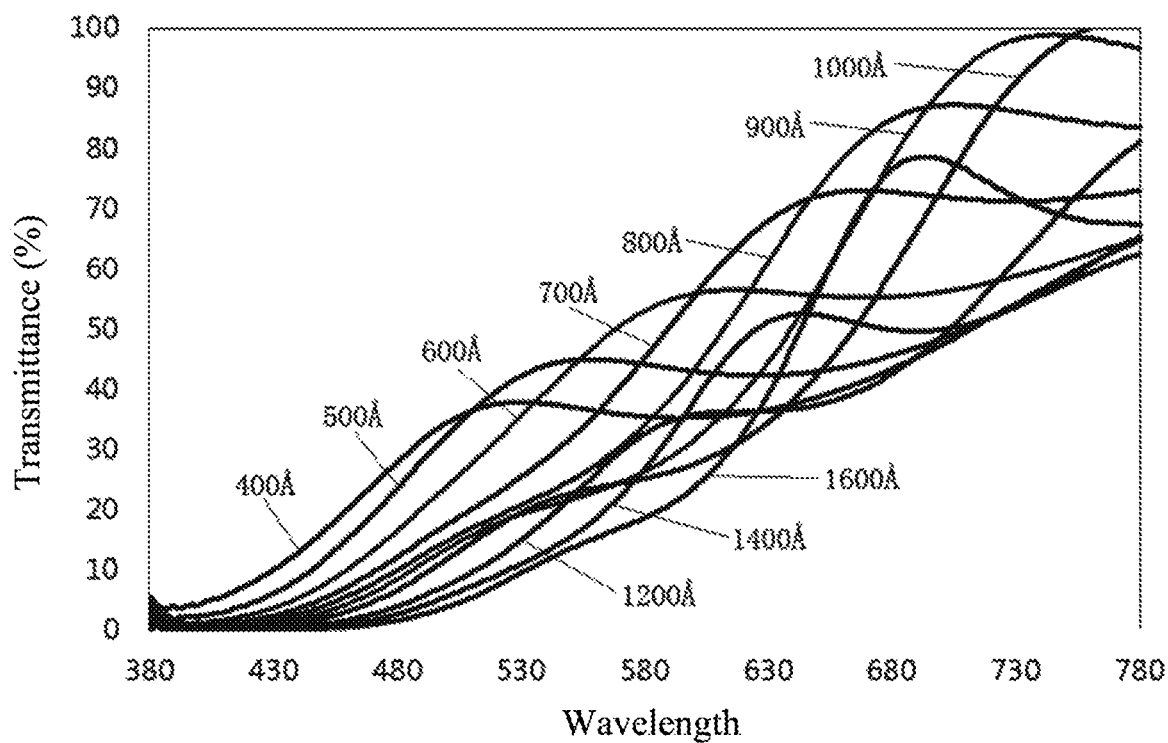
FIG. 3 shows a graph of transmittance of amorphous silicon with different thicknesses according to an embodiment of the present application.

According to an embodiment of the present application, the intrinsic semiconductor layer 200 may be composed of amorphous silicon (a-Si). The thickness of the first part 210 may be 1000-3000 Å. The inventors find that when the thickness of amorphous silicon is about 1200 Å, its light absorption characteristic is relatively strong. As the thickness of amorphous silicon continues to increase, its absorption of light does not further increase significantly (referring to FIG. 3). By setting the thickness of the first part 210 within the above range, the amorphous silicon in the first part 210 has strong light absorption ability, and there may be more light to make the metal particles generate the surface plasmon effect, thus further enhancing the light absorption rate of the photosensitive sensor and further improving the signal-to-noise ratio and sensitivity of the photosensitive sensor.

The specific value of the thickness of the intrinsic semiconductor layer (i.e., I layer) is not particularly limited. Those skilled in the art may choose the thickness commonly used in the I layer of the PIN device. For example, according to an embodiment of the present application, the thickness of the intrinsic semiconductor layer 200 may be 5000-10000 Å.

According to an embodiment of the present application, the intrinsic semiconductor layer 200 includes a first part 210 and a second part 220 which are stacked. A sum of the thickness of the first part 210 and the thickness of the second part 220 is the total thickness of the intrinsic semiconductor layer 200. For example, when the thickness of the intrinsic semiconductor layer 200 is 10000 Å, the thickness of the first part 210 is 1000-3000 Å, and then the thickness of the second part 220 is 7000-9000 Å.

Figure 4:
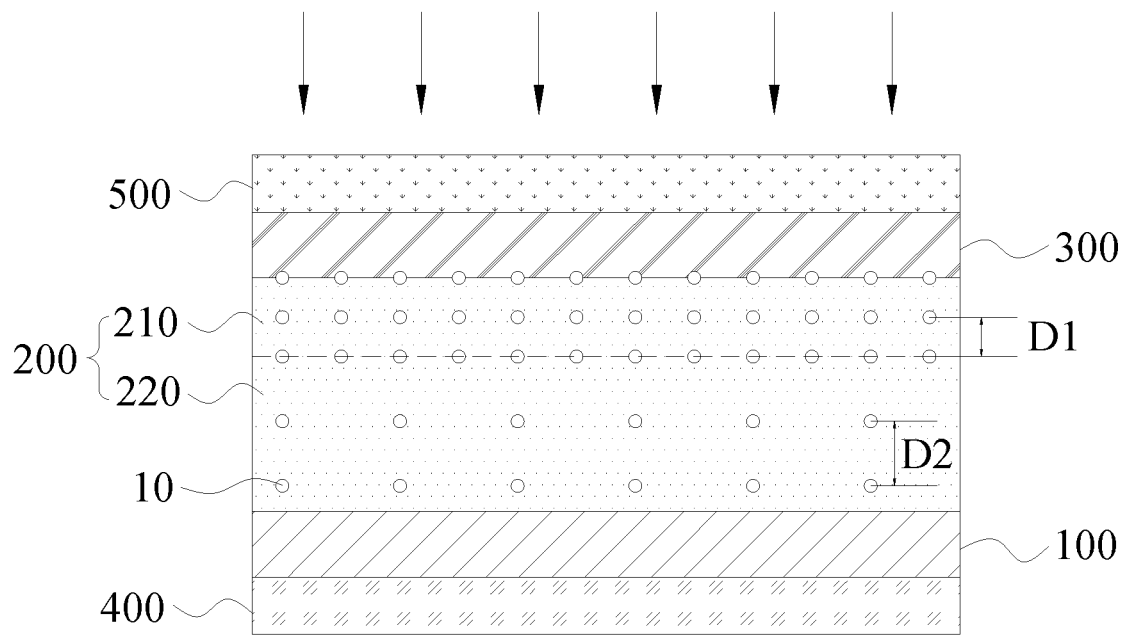
FIG. 4 shows a schematic structural diagram of a photosensitive sensor according to an embodiment of the present application.

According to an embodiment of the present application, referring to FIG. 4, a layer of metal particles 10 is arranged at an interval of 200-600 Å in thickness (D1 as shown in the figure) in the first part 210, and a layer of metal particles 10 is arranged at an interval of 1000-2000 Å in thickness (D2 as shown in the figure) in the second part 220. Therefore, a plurality of layers of metal particles are respectively arranged in the first part and the second part, and there is a proper spacing distance between layers of metal particles, so that the light absorption rate of the photosensitive sensor may be further enhanced, and the signal-to-noise ratio and sensitivity of the photosensitive sensor may be further improved. It should be noted that the metal particles at an interval of D1 or D2 in thickness form a discontinuous structure. Particularly, the discontinuous structure may be formed by controlling parameters during the deposition by sputtering to prevent the metal particles from adversely affecting the normal use of the intrinsic semiconductor layer.

According to an exemplary embodiment of the present application, a layer of metal particles 10 is arranged at an interval of 500 Å in thickness in the first part 210, and a layer of metal particles 10 is arranged at an interval of 1500 Å in thickness in the second part 220. As a result, the light absorption rate of the photosensitive sensor may be further enhanced, and the signal-to-noise ratio and sensitivity of the photosensitive sensor may be further improved.

According to an embodiment of the present application, referring to FIG. 4, a second type semiconductor layer 300 is located on the side of the photosensitive sensor where light enters the photosensitive sensor. The second type semiconductor layer 300 is composed of a transparent semiconductor material, and metal particles 10 are disposed at the interface between the second type semiconductor layer 300 and the intrinsic semiconductor layer 200. The second type semiconductor layer being composed of a transparent semiconductor material may ensure that light is able to enter the photosensitive sensor from a side of the second type semiconductor layer. At this time, there is most intense light at the interface between the second type semiconductor layer and the intrinsic semiconductor layer. By arranging the metal particles at the above-mentioned interface, a strongest surface plasmon effect may be obtained, further enhancing the light absorption rate of the photosensitive sensor and further improving the signal-to-noise ratio and sensitivity of the photosensitive sensor. The transparent semiconductor material constituting the second type semiconductor layer is not particularly limited, and may be designed by those skilled in the art according to specific conditions. For example, according to a specific embodiment of the present application, the above-mentioned transparent semiconductor material may be indium tin oxide (ITO).

Specific types and thicknesses of the first type semiconductor layer and the second type semiconductor layer are not particularly limited, and may be designed by those skilled in the art according to specific conditions. For example, according to a specific embodiment of the present application, the first type semiconductor layer 100 may be a P-type semiconductor layer. The second type semiconductor layer 300 may be an N-type semiconductor layer. A thickness of the first type semiconductor layer 100 may be 1000-3000 Å. A thickness of the second type semiconductor layer 300 may be 500-2000 Å. As a result, the photosensitive sensor may have good service performances.

According to an embodiment of the present application, referring to FIG. 4, the photosensitive sensor may further include a first electrode 400 and a second electrode 500. The first electrode 400 is disposed on a side of the first type semiconductor layer 100 away from the intrinsic semiconductor layer 200. The second electrode 500 is disposed on a side of the second type semiconductor layer 300 away from the intrinsic semiconductor layer 200. As a result, a voltage may be applied to the photosensitive sensor through the first electrode and the second electrode, to achieve the operation of the photosensitive sensor.

According to an embodiment of the present application, the electrode on the side of the photosensitive sensor where light enters the photosensitive sensor is composed of a transparent conductive material. As a result, it may ensure that light is able to enter the photosensitive sensor through the electrode.

According to an embodiment of the present application, the photosensitive sensor may be a fingerprint recognition sensor. Therefore, the fingerprint recognition sensor has high signal-to-noise ratio and sensitivity, which may significantly improve the user experience.

In another aspect of the present application, the present application provides a method for manufacturing a photosensitive sensor. According to an embodiment of the present application, the photosensitive sensor manufactured by the method may be the photosensitive sensor described above. As a result, the photosensitive sensor manufactured by the method may have the same characteristics and advantages as the photosensitive sensor described above, which will not be described in detail here.

Figure 5:
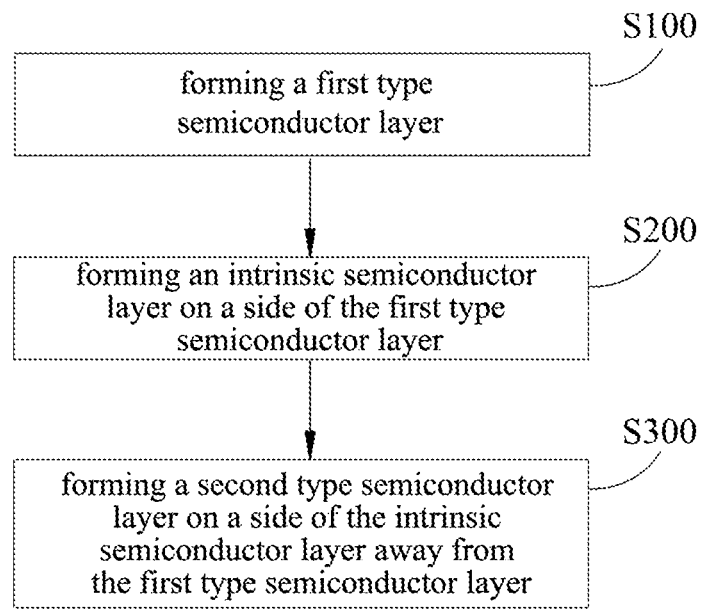
FIG. 5 shows a schematic flow chart of a method for manufacturing a photosensitive sensor according to an embodiment of the present application.

According to an embodiment of the present application, referring to FIG. 5, the method includes S100, S200 and S300.

S100: a first type semiconductor layer is formed.

According to an embodiment of the present application, in this step, a first type semiconductor layer is formed. The specific type and thickness of the first type semiconductor layer have been described in detail above, and will not be repeated here.

According to an embodiment of the present application, the first type semiconductor layer may be formed on a side of the first electrode. The first electrode and the subsequently arranged second electrode may apply voltage to the photosensitive sensor, to achieve the operation of the photosensitive sensor.

The method of forming the first type semiconductor layer is not particularly limited, and may be designed by those skilled in the art according to specific conditions. For example, according to an embodiment of the present application, the first type semiconductor layer may be formed by plasma enhanced chemical vapor deposition (PECVD).

S200: an intrinsic semiconductor layer is formed on a side of the first type semiconductor layer.

According to an embodiment of the present application, in this step, an intrinsic semiconductor layer is formed on a side of the first type semiconductor layer, particularly on a side of the first type semiconductor layer away from the first electrode. According to an embodiment of the present application, the formed intrinsic semiconductor layer is provided with metal particles capable of generating a surface plasmon effect, and the metal particles are dispersely distributed in the intrinsic semiconductor layer. As a result, the surface plasmon effect generated by the metal particles may be used to enhance the light absorption rate of the finally obtained photosensitive sensor, so as to improve the signal-to-noise ratio and sensitivity of the photosensitive sensor and significantly improve the user experience. In addition, the metal particles being dispersely distributed in the intrinsic semiconductor layer may prevent the metal particles from adversely affecting the normal use of the intrinsic semiconductor layer.

According to an embodiment of the present application, the intrinsic semiconductor layer may be composed of amorphous silicon, and includes a first part and a second part which are stacked. The first part is close to the side of the photosensitive sensor where light enters the photosensitive sensor, and the arrangement density of the metal particles in the first part is greater than the arrangement density of the metal particles in the second part. As a result, more metal particles are arranged close to the side of the photosensitive sensor where light enters the photosensitive sensor, and there may be more metal particles to generate a surface plasmon effect, further enhancing the light absorption rate of the finally obtained photosensitive sensor, and further improving the signal-to-noise ratio and sensitivity of the photosensitive sensor.

According to an embodiment of the present application, a thickness of the first part may be 1000-3000 Å. By setting the thickness of the first part within the above range, the amorphous silicon in the first part has stronger light absorption ability, and there may be more light to make the metal particles generate the surface plasmon effect, thus further enhancing the light absorption rate of the finally obtained photosensitive sensor and further improving signal-to-noise ratio and sensitivity of the photosensitive sensor. The principle of setting the thickness of the first part within the above range has been described in detail above, and will not be repeated here.

According to an embodiment of the present application, forming an intrinsic semiconductor layer may be achieved by the following steps: first depositing a first amorphous silicon layer on a side of the first type semiconductor layer away from the first electrode; then depositing metal particles on a side of the first amorphous silicon layer away from the first type semiconductor layer and depositing a second amorphous silicon layer on a side of the metal particles away from the first amorphous silicon layer; and then sequentially repeating the steps of depositing the metal particles and the second amorphous silicon layer, until the metal particles are disposed on a side of the second amorphous silicon layer away from the first type semiconductor layer, so as to obtain the intrinsic semiconductor layer.

The amorphous silicon layer may be formed by a PECVD method. In the process of depositing amorphous silicon layer, the thickness of the amorphous silicon layer is controlled by controlling the deposition time, so as to form metal particles between any two amorphous silicon layers. As a result, the metal particles may be arranged in the intrinsic semiconductor layer by such a simple method.

According to an embodiment of the present application, the metal particles are formed by deposition through sputtering. Disperse distribution of the metal particles in the intrinsic semiconductor layer may be achieved by controlling parameters during the deposition by sputtering, such as power, deposition chamber pressure, flow rate of inert gas, number of scans and working temperature of deposition chamber. As a result, the disperse distribution of the metal particles in the intrinsic semiconductor layer may be achieved by controlling the above parameters, which prevents the metal particles from adversely affecting the photoelectric effect of the intrinsic semiconductor layer. In addition, the dispersely distributed metal particles may not be discharged in the subsequent PECVD process.

According to an embodiment of the present application, the metal particles may include at least one of gold, silver, copper, platinum and aluminum. The specific values of various parameters in the process of depositing metal particles by sputtering are not particularly limited and may be designed by those skilled in the art according to specific conditions, as long as dispersely distributed metal particles may be formed. For example, according to an embodiment of the present application, taking the process of depositing copper particles by sputtering as an example, the sputtering power may be 500 W, the deposition chamber pressure may be 0.3 Pa, the inert gas may be argon, the flow rate of the gas may be 100 sccm, the number of scan may be 1, and the working temperature of the deposition chamber may be 100° C. As a result, the copper particles may be effectively attached and dispersely distributed onto the amorphous silicon layer, to obtain an intrinsic semiconductor layer with copper particles, in order to enhance the light absorption rate of the finally obtained photosensitive sensor and improve the signal-to-noise ratio and sensitivity of the photosensitive sensor.

According to an embodiment of the present application, the thickness of the amorphous silicon layer between two adjacent layers of the metal particles in the first part may be 200-600 Å. The thickness of the amorphous silicon layer between two adjacent layers of the metal particles in the second part may be 1000-2000 Å. As a result, a plurality of layers of metal particles are respectively arranged in the first part and the second part, and there is a proper spacing distance between layers of metal particles, so that the light absorption rate of the finally obtained photosensitive sensor may be further enhanced, and the signal-to-noise ratio and sensitivity of the photosensitive sensor may be further improved. According to an exemplary embodiment of the present application, the thickness of the amorphous silicon layer between two adjacent layers of the metal particles in the first part may be 500 Å. The thickness of the amorphous silicon layer between two adjacent layers of the metal particles in the second part may be 1500 Å. It should be noted that "two layers of metal particles" refers to two layers of discontinuous structures formed by metal particles.

The principle of the metal particles generating a plasmon effect to enhance the light absorption rate of photosensitive sensors has been described in detail above, and will not be repeated here.

S300: a second type semiconductor layer is formed on a side of the intrinsic semiconductor layer away from the first type semiconductor layer.

According to an embodiment of the present application, in this step, a second type semiconductor layer is formed on a side of the intrinsic semiconductor layer away from the first type semiconductor layer. The specific type, thickness and composition material of the second type semiconductor layer have been described in detail above, and will not be repeated here.

The method of forming the second type semiconductor layer is not particularly limited, and may be designed by those skilled in the art according to specific conditions. For example, according to an embodiment of the present application, the second type semiconductor layer may be formed by a PECVD method.

According to an embodiment of the present application, the second type semiconductor layer may be located on the side of the photosensitive sensor where light enters the photosensitive sensor, and metal particles are formed at the interface between the second type semiconductor layer and the intrinsic semiconductor layer. When the second type semiconductor layer is located on the side of the photosensitive sensor where light enters the photosensitive sensor, there is most intense light at the interface between the second type semiconductor layer and the intrinsic semiconductor layer. By arranging the metal particles at the above interface, a strongest surface plasmon effect may be obtained, further enhancing the light absorption rate of the finally obtained photosensitive sensor and further improving the signal-to-noise ratio and sensitivity of the photosensitive sensor.

According to an embodiment of the present application, the method further includes forming a second electrode on a side of the second type semiconductor layer away from the intrinsic semiconductor layer. As a result, a voltage may be applied to the photosensitive sensor through the first electrode and the second electrode, to achieve the operation of the photosensitive sensor.

In another aspect of the present application, the present application provides a display panel. According to an embodiment of the present application, referring to FIG. 6, the display panel includes an array substrate 600. A photosensitive sensor 1000 and a thin film transistor 700 are disposed on the array substrate 600. The photosensitive sensor 1000 is the photosensitive sensor described above. The thin film transistor 700 is configured to control the photosensitive sensor 1000. As a result, the display panel has all the features and advantages of the photosensitive sensor described above, which will not be repeated here. In general, the display panel has high sensitivity in the recognition function, and the photosensitive sensor is integrated in the display panel, which may save the space of the final mobile product and achieve the lightening and thinning of the mobile product.

According to an embodiment of the present application, the photosensitive sensor 1000 may be a fingerprint recognition sensor. As a result, the sensitivity of fingerprint recognition of the display panel may be improved.

The inventors find that fingerprint recognition in related technologies is performed by utilizing independent modules, and such a solution requires that a separate space is reserved for the fingerprint recognition module when designing the mobile product, which is not beneficial to the lightening and thinning of the mobile product.

According to an embodiment of the present application, the photosensitive sensor 1000 is integrated in the display panel. As a result, it is not needed to design a special fingerprint recognition module on the mobile product, which may effectively save the internal space of the mobile product, and is beneficial to the lightening and thinning of the mobile product.

Figure 6:
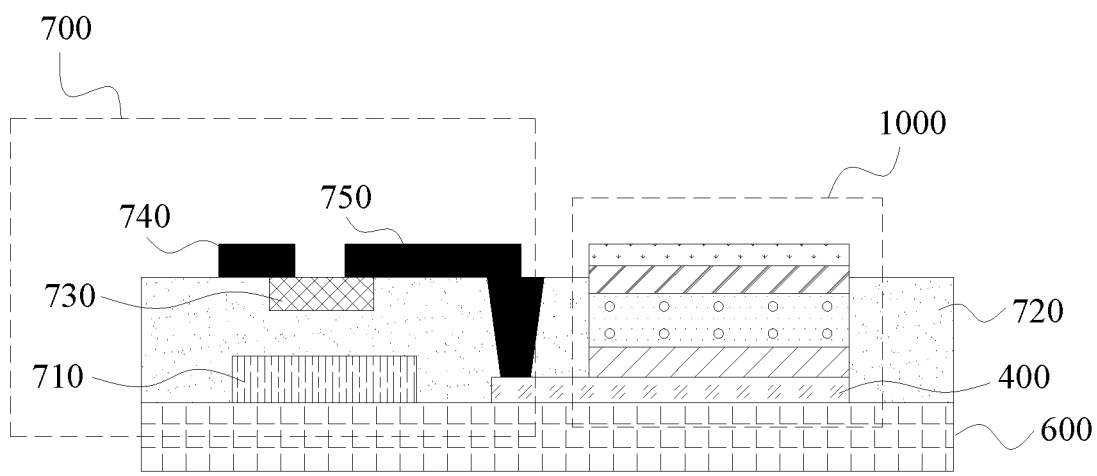
FIG. 6 shows a schematic structural diagram of a display panel according to an embodiment of the present application.

According to an embodiment of the present application, referring to FIG. 6, the thin film transistor 700 may include a gate electrode 710, a gate insulating layer 720, an active layer 730, a source electrode 740 and a drain electrode 750. The drain electrode 750 is electrically connected to the first electrode 400 of the photosensitive sensor 1000. As a result, control of the photosensitive sensor may be achieved by the thin film transistor, to achieve the operation of the photosensitive sensor. It should be noted that the thin film transistor 700 herein is a thin film transistor for controlling the photosensitive sensor 1000. As the display panel also includes a thin film transistor structure, the thin film transistor 700 may be prepared synchronously with other thin film transistors in the display panel to simplify the process.

According to an embodiment of the present application, the metal particles include at least one of gold, silver, copper, platinum and aluminum.

According to an embodiment of the present application, the intrinsic semiconductor layer includes a first part and a second part which are stacked along a thickness direction of the intrinsic semiconductor layer. The first part is close to a side of the photosensitive sensor where light enters the photosensitive sensor. An arrangement density of the metal particles in the first part is greater than an arrangement density of the metal particles in the second part.

According to an embodiment of the present application, a thickness of the first part is 1000-3000 Å.

According to an embodiment of the present application, a layer of the metal particles is disposed in the first part at an interval of 200-600 Å in thickness.

According to an embodiment of the present application, a layer of the metal particles is disposed in the second part at an interval of 1000-2000 Å in thickness.

According to an embodiment of the present application, a layer of the metal particles is disposed in the first part at an interval of 500 Å in thickness.

According to an embodiment of the present application, a layer of the metal particles is disposed in the second part at an interval of 1500 Å in thickness.

According to an embodiment of the present application, a thickness of the intrinsic semiconductor layer is 5000-10000 Å.

According to an embodiment of the present application, the second type semiconductor layer is located on a side of the intrinsic semiconductor layer where light enters the intrinsic semiconductor layer. The second type semiconductor layer is composed of a transparent semiconductor material. The metal particles are disposed at an interface between the second type semiconductor layer and the intrinsic semiconductor layer.

According to an embodiment of the present application, the transparent semiconductor material includes indium tin oxide.

According to an embodiment of the present application, the first type semiconductor layer is a P-type semiconductor layer. The second type semiconductor layer is an N-type semiconductor layer.

According to an embodiment of the present application, a thickness of the first type semiconductor layer is 1000-3000 Å.

According to an embodiment of the present application, a thickness of the second type semiconductor layer is 500-2000 Å.

According to an embodiment of the present application, the photosensitive sensor further includes a first electrode disposed on a side of the first type semiconductor layer away from the intrinsic semiconductor layer, and a second electrode located on a side of the second type semiconductor layer away from the intrinsic semiconductor layer.

According to an embodiment of the present application, the photosensitive sensor is a fingerprint recognition sensor.

According to an embodiment of the present application, the intrinsic semiconductor layer includes a first part and a second part which are stacked along a thickness direction of the intrinsic semiconductor layer. The first part is close to a side of the photosensitive sensor where light enters the photosensitive sensor. An arrangement density of the metal particles in the first part is greater than an arrangement density of the metal particles in the second part.

According to an embodiment of the present application, the second type semiconductor layer is located on a side of the intrinsic semiconductor layer where light enters the intrinsic semiconductor layer. Forming the intrinsic semiconductor layer includes depositing a first amorphous silicon layer on a side of the first type semiconductor layer; depositing the metal particles on a side of the first amorphous silicon layer away from the first type semiconductor layer; and depositing a second amorphous silicon layer on a side of the metal particles away from the first amorphous silicon layer; and sequentially repeating the steps of depositing the metal particles and the second amorphous silicon layer, until the metal particles are formed at an interface between the second amorphous silicon layer and the second type semiconductor layer, so as to obtain the intrinsic semiconductor layer.

According to an embodiment of the present application, the thickness of the first part in the intrinsic semiconductor layer is 1000-3000 Å. The thickness of the amorphous silicon layer between two adjacent layers of the metal particles in the first part is 200-600 Å. The thickness of the amorphous silicon layer between two adjacent layers of the metal particles in the second part is 1000-2000 Å.

According to an embodiment of the present application, the metal particles are formed by deposition through a sputtering method. Disperse distribution of the metal particles in the intrinsic semiconductor layer is achieved by controlling power, deposition chamber pressure, flow rate of inert gas, number of scans and working temperature of deposition chamber during the deposition by sputtering.

According to an embodiment of the present application, the metal particles include copper. The power of the deposition by sputtering is 500 W. The deposition chamber pressure is 0.3 Pa. The inert gas is argon. The flow rate of the inert gas is 100 sccm. The number of scan is 1. The working temperature of the deposition chamber is 100° C.

According to an embodiment of the present application, a way of forming the first type semiconductor layer, the second type semiconductor layer and the intrinsic semiconductor layer includes plasma enhanced chemical vapor deposition.

In the description of the present application, an orientation or a position relationship indicated by terms "upper", "lower" and the like is based on an orientation or a position relationship shown in the drawings, and is only for convenience of description of the present application, but does not require that the present application must be constructed and operated in a specific orientation, and therefore it cannot be understood as a limitation on the present application.

In the description of this specification, reference to the terms "an embodiment", "another embodiment" and the like means that a specific feature, structure, material, or characteristic described in connection with this embodiment is included in at least one embodiment of the present application. In this specification, the schematic representation of the above-mentioned terms is not necessarily directed to the same embodiment or example. Moreover, the specific feature, structure, material, or characteristic described may be combined in any one or more embodiments or examples in a proper way. In addition, those skilled in the art may incorporate and combine different embodiments or examples and features of different embodiments or examples described in this specification if they do not conflict with each other. In addition, it should be noted that the terms "first" and "second" in the specification are used for description purposes only, and cannot be interpreted as indicating or implying relative importance or implicitly indicating the number of technical features referred to.

Although embodiments of the present application have been shown and described above, it should be understood that above embodiments are exemplary, and cannot be construed as limiting the present application. For those of ordinary skills in the art, changes, modifications, substitutions and alternatives may be made to the above embodiments without departing from the scope of the present application.

What is claimed is:

1. A photosensitive sensor, comprising:
a first type semiconductor layer;
an intrinsic semiconductor layer disposed on a side of the first type semiconductor layer; and
a second type semiconductor layer disposed on a side of the intrinsic semiconductor layer away from the first type semiconductor layer,
wherein the intrinsic semiconductor layer is provided with metal particles capable of generating a surface plasmon effect, and the metal particles are dispersely distributed in the intrinsic semiconductor layer;
wherein the intrinsic semiconductor layer comprises a first part and a second part which are stacked along a thickness direction of the intrinsic semiconductor layer, the first part is close to a side of the photosensitive sensor where light enters the photosensitive sensor, and an arrangement density of the metal particles in the first part is greater than an arrangement density of the metal particles in the second part; and
wherein a thickness of the first part is 1000-3000 Å.

2. The photosensitive sensor of claim 1, wherein the metal particles comprise at least one of gold, silver, copper, platinum and aluminum.

3. The photosensitive sensor of claim 1, wherein a layer of the metal particles is disposed in the first part at an interval of 200-600 Å in thickness; or wherein a layer of the metal particles is disposed in the first part at an interval of 500 Å in thickness.

4. The photosensitive sensor of claim 1, wherein a layer of the metal particles is disposed in the second part at an interval of 1000-2000 Å in thickness; or wherein a layer of the metal particles is disposed in the second part at an interval of 1500 Å in thickness.

5. The photosensitive sensor of claim 1, wherein a thickness of the intrinsic semiconductor layer is 5000-10000 Å.

6. The photosensitive sensor of claim 1, wherein a material constituting the intrinsic semiconductor layer comprises amorphous silicon.

7. The photosensitive sensor of claim 1, wherein the second type semiconductor layer is located on a side of the intrinsic semiconductor layer where light enters the intrinsic semiconductor layer, the second type semiconductor layer comprises a transparent semiconductor material, and the metal particles are disposed at an interface between the second type semiconductor layer and the intrinsic semiconductor layer.

8. The photosensitive sensor of claim 7, wherein the transparent semiconductor material comprises indium tin oxide.

9. The photosensitive sensor of claim 1, wherein the first type semiconductor layer is a P-type semiconductor layer and the second type semiconductor layer is an N-type semiconductor layer.

10. The photosensitive sensor of claim 1, wherein a thickness of the first type semiconductor layer is 1000-3000 Å.

11. The photosensitive sensor of claim 1, wherein a thickness of the second type semiconductor layer is 500-2000 Å.

12. The photosensitive sensor of claim 1, further comprising:
a first electrode disposed on a side of the first type semiconductor layer away from the intrinsic semiconductor layer; and
a second electrode located on a side of the second type semiconductor layer away from the intrinsic semiconductor layer.

13. The photosensitive sensor of claim 1, wherein the photosensitive sensor is a fingerprint recognition sensor.

14. A display panel, comprising:
an array substrate, wherein a photosensitive sensor and a thin film transistor are arranged on the array substrate, the photosensitive sensor is a photosensitive sensor of claim 1, and the thin film transistor is configured to control the photosensitive sensor.

15. A method for manufacturing a photosensitive sensor, comprising:
forming a first type semiconductor layer;
forming an intrinsic semiconductor layer on a side of the first type semiconductor layer, wherein the intrinsic semiconductor layer is provided with metal particles capable of generating a surface plasmon effect, and the metal particles are dispersely distributed in the intrinsic semiconductor layer; and
forming a second type semiconductor layer on a side of the intrinsic semiconductor layer away from the first type semiconductor layer,
wherein the intrinsic semiconductor layer comprises a first part and a second part which are stacked along a thickness direction of the intrinsic semiconductor layer, the first part is close to a side of the photosensitive sensor where light enters the photosensitive sensor, and an arrangement density of the metal particles in the first part is greater than an arrangement density of the metal particles in the second part; and
wherein a thickness of the first part is 1000-3000 Å.

16. The method of claim 15, wherein the metal particles are formed by deposition through a sputtering method, and disperse distribution of the metal particles in the intrinsic semiconductor layer is achieved by controlling power, deposition chamber pressure, flow rate of inert gas, number of scans and working temperature of deposition chamber during the deposition by sputtering.

17. The method of claim 16, wherein the metal particles comprise copper, the power of the deposition by sputtering is 500 W, the deposition chamber pressure is 0.3 Pa, the inert gas is argon, the flow rate of the inert gas is 100 sccm, number of scan is 1, and the working temperature of the deposition chamber is 100° C.

18. The method of claim 15, wherein a way of forming the first type semiconductor layer, the second type semiconductor layer and the intrinsic semiconductor layer comprises plasma enhanced chemical vapor deposition.

* * * * *